United States Patent
Kezuka et al.

(10) Patent No.: US 11,469,027 B2
(45) Date of Patent: Oct. 11, 2022

(54) BUILT-IN-COIL SUBSTRATE AND METHOD FOR MANUFACTURING THE SAME

(71) Applicant: Murata Manufacturing Co., Ltd., Nagaokakyo (JP)

(72) Inventors: Shuichi Kezuka, Nagaokakyo (JP); Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1508 days.

(21) Appl. No.: 15/632,415

(22) Filed: Jun. 26, 2017

(65) Prior Publication Data

US 2017/0294258 A1    Oct. 12, 2017

Related U.S. Application Data

(63) Continuation of application No. PCT/JP2016/053302, filed on Feb. 4, 2016.

(30) Foreign Application Priority Data

Feb. 18, 2015  (JP) .............................. JP2015-029634

(51) Int. Cl.
*H01F 17/00* (2006.01)
*H05K 1/16* (2006.01)
(Continued)

(52) U.S. Cl.
CPC ......... *H01F 17/0013* (2013.01); *H05K 1/165* (2013.01); *H01F 2017/002* (2013.01);
(Continued)

(58) Field of Classification Search
CPC ............. H01F 27/2804; H01F 17/0006; H01F 17/0013; H01F 2017/0046;
(Continued)

(56) References Cited

U.S. PATENT DOCUMENTS 3,848,210 A * 11/1974 Felkner .................. H01F 17/04
336/200
2002/0038680 A1* 4/2002 Arai ...................... H01F 1/0571
428/378
(Continued)

FOREIGN PATENT DOCUMENTS

JP       04-018787 A       1/1992
JP     2000173835 A  *    6/2000
(Continued)

OTHER PUBLICATIONS

Official Communication issued in International Patent Application No. PCT/JP2016/053302, dated Mar. 8, 2016.
(Continued)

*Primary Examiner* — Tszfung J Chan
(74) *Attorney, Agent, or Firm* — Keating & Bennett, LLP (57) ABSTRACT

In a built-in coil substrate, coil conductor patterns are provided on insulating base materials. Coil interlayer connection conductors, which provide interlayer connection between the coil conductor patterns, are provided on the insulating base materials and made of conductive paste. First and second external electrodes are provided on a first principal surface of a multilayer body. One of the coil conductor patterns is connected to the first external electrode by first-external-electrode connection conductors made of the conductive paste. Another one of the coil conductor patterns is connected to the second external electrode by a second-external-electrode connection conductor. The second-external-electrode connection conductor is a metal film provided in a through hole that extends through the multilayer body in a stacking direction in which the insulating base materials are stacked.

10 Claims, 8 Drawing Sheets

(51) Int. Cl.
  *H01L 23/14* (2006.01)
  *H01L 23/498* (2006.01)
  *H05K 3/46* (2006.01)

(52) U.S. Cl.
  CPC ...... *H01L 23/145* (2013.01); *H01L 23/49822* (2013.01); *H05K 3/4632* (2013.01); *H05K 2201/0129* (2013.01)

(58) Field of Classification Search
  CPC ..... H01F 2017/0073; H01F 2027/2809; H01F 5/003; H01F 2017/002
  USPC .................................................. 336/200, 232
  See application file for complete search history.

(56) References Cited

U.S. PATENT DOCUMENTS

| | | | |
|---|---|---|---|
| 2003/0030510 A1* | 2/2003 | Sasaki | H03H 7/0115 333/185 |
| 2003/0030994 A1 | 2/2003 | Takaya et al. | |
| 2004/0000701 A1* | 1/2004 | White | H01L 27/08 257/664 |
| 2007/0222549 A1* | 9/2007 | Lim | H01F 17/0033 336/200 |
| 2010/0171581 A1* | 7/2010 | Manoukian | H01F 5/003 336/192 |
| 2011/0001599 A1* | 1/2011 | Takenaka | H01F 17/0013 336/200 |
| 2011/0285494 A1* | 11/2011 | Jeong | H01F 17/0013 336/200 |
| 2011/0291787 A1* | 12/2011 | Dalmia | H01F 17/0006 336/200 |
| 2013/0321115 A1* | 12/2013 | Lee | H01F 41/046 336/200 |
| 2014/0034373 A1* | 2/2014 | Yoshikawa | H05K 1/165 174/260 |
| 2014/0203986 A1 | 7/2014 | Kato et al. | |
| 2014/0225702 A1 | 8/2014 | Yazaki | |
| 2015/0138030 A1 | 5/2015 | Yosui et al. | |
| 2017/0365387 A1* | 12/2017 | Kusawake | H02M 3/158 |

FOREIGN PATENT DOCUMENTS

| | | | |
|---|---|---|---|
| JP | 2002-158135 A | | 5/2002 |
| JP | 2006-128519 A | | 5/2006 |
| JP | 2007-317838 A | | 12/2007 |
| JP | 2007317838 A | * | 12/2007 |
| JP | 5621946 B2 | | 11/2014 |
| WO | 2013/105565 A1 | | 7/2013 |
| WO | 2015/016353 A1 | | 2/2015 |

OTHER PUBLICATIONS

Official Communication issued in Japanese Patent Application No. 2017-500594, dated Oct. 31, 2017.

\* cited by examiner

BUILT-IN-COIL SUBSTRATE AND METHOD FOR MANUFACTURING THE SAME

CROSS REFERENCE TO RELATED APPLICATIONS

This application claims the benefit of priority to Japanese Patent Application No. 2015-029634 filed on Feb. 18, 2015 and is a Continuation Application of PCT Application No. PCT/JP2016/053302 filed on Feb. 4, 2016. The entire contents of each application are hereby incorporated herein by reference.

BACKGROUND OF THE INVENTION

1. Field of the Invention

The present invention relates to a built-in-coil substrate including a built-in coil for a high-frequency circuit and a method for manufacturing the built-in-coil substrate.

2. Description of the Related Art

Japanese Unexamined Patent Application Publication No. 2007-317838, for example, describes a thin circuit device including a coil obtained by forming the coil in a multilayer substrate. Components such as chip coils may also have the structure in which a coil is provided in a multilayer substrate. It is reasonable to form a coil by stacking insulating base materials on which coil conductor patterns are formed and connecting the layers to each other by using via conductors, as described in Japanese Unexamined Patent Application Publication No. 2007-317838, because the coil conductor patterns can be connected to each other through interlayer connection for each layer.

The above-described coil, which is structured as a surface mount device, is required to have mounting connection electrodes on the same surface (mounting surface) of the device. The above-described coil is a substantially helical coil with a coil winding axis extending in a stacking direction in which the insulating base materials are stacked. Therefore, a first end of the coil and a first connection electrode on the mounting surface are close to each other and are connected to each other by a via conductor. However, a second end of the coil and a second connection electrode on the mounting surface are connected to each other by via conductors provided in multiple insulating base materials.

Unfortunately, in the case where via conductors made of solidified conductive paste are used as interlayer connection conductors, the interlayer connection conductors have a high electrical resistance. This is because the conductive paste is solidified at a temperature at which the multilayer body is formed, and therefore the materials that can be used as the conductive paste and solidifying conditions are limited, which makes it difficult to form reliable conduction paths between metal particles. In particular, the connection path between the second end of the above-described coil and the second connection electrode of the mounting surface has a significantly high conductor resistance because the connection path is very long and includes a large number of interlayer connections.

Furthermore, when a large number of via conductors are formed by solidifying the conductive paste so as to be stacked together, the rigidity of the portion is locally increased, and thus it becomes difficult to form stable conductor patterns in the multilayer body in the manufacturing process.

SUMMARY OF THE INVENTION

Preferred embodiments of the present invention provide a built-in-coil substrate in which each end of a coil is connected to a corresponding one of two external electrodes on a same surface and which has a structure that is effective in reducing the conductor resistance of the connecting portions and increasing reliability of the connecting portions, and provide a method for manufacturing the built-in-coil substrate.

A built-in-coil substrate according to a preferred embodiment of the present invention includes a coil including a conductor pattern in a multilayer body of a plurality of insulating base materials by stacking the plurality of insulating base materials including an insulating base material on which the conductor pattern is provided. The conductor pattern includes coil conductor patterns provided on surfaces of the plurality of insulating base materials; a coil interlayer connection conductor made of solidified conductive paste, the coil interlayer connection conductor providing interlayer connection between the coil conductor patterns that are adjacent to each other in a stacking direction in which the plurality of insulating base materials are stacked; a first external electrode and a second external electrode provided on a first principal surface of the multilayer body; and a first-external-electrode connection conductor that connects one of the coil conductor patterns that is close to the first principal surface of the multilayer body (first end of the coil) to the first external electrode. The coil has a winding axis extending in the stacking direction of the plurality of insulating base materials. The built-in-coil substrate includes second-external-electrode connection conductor connecting one of the coil conductor patterns that is far from the first principal surface of the multilayer body (second end of the coil) to the second external electrode. The second-external-electrode connection conductor includes a conductor that provides interlayer connection between the plurality of insulating base materials, the conductor being a metal film provided in a through hole that extends through the multilayer body in the stacking direction of the plurality of insulating base materials.

According to the above-described structure, the second-external-electrode connection conductor, which is a conductor (conductor with a long path length) that connects the coil conductor pattern far from the first principal surface of the multilayer body (second end of the coil) to the second external electrode, includes a conductor that provides interlayer connection between the insulating base materials, the conductor being defined by the metal film provided in the through hole that extends through the multilayer body in the stacking direction. Therefore, the conductor resistance is reduced. In addition, the reliability of the conductor is able to be easily increased.

An insulating base material may be a thermoplastic resin sheet. In a case where the insulating base material is a thermoplastic resin sheet, resin flow easily occurs when the multilayer body is formed by hot pressing. However, the second-external-electrode connection conductor is not a stack of via conductors formed by solidifying the conductive paste, that is, not provided in the stacking process. Therefore, the second-external-electrode connection conductor is able to be easily manufactured.

A method for manufacturing a built-in-coil substrate according to a preferred embodiment of the present invention includes forming coil conductor patterns, a first external electrode, and a second external electrode on a surface of an insulating base material; forming a hole in the insulating base material; forming a coil interlayer connection conductor and a first-external-electrode connection conductor by filling the hole with conductive paste; stacking a plurality of insulating base materials including the insulating base material on or in which the coil conductor patterns or the coil interlayer connection conductor is formed; hot-pressing the plurality of insulating base materials that are stacked to form a multilayer body including the plurality of insulating base materials and to solidify the conductive paste; forming a through hole in the multilayer body, the through hole extending in a stacking direction in which the plurality of insulating base materials are stacked; and forming a metal film in the through hole. The coil conductor patterns provided on surfaces of the plurality of insulating base materials and the coil interlayer connection conductor form a coil with a winding axis extending in the stacking direction of the plurality of insulating base materials. The first external electrode which is provided on a first principal surface of the multilayer body is connected to one of the coil conductor patterns that is close to the first principal surface of the multilayer body by the first-external-electrode connection conductor. One of the coil conductor patterns that is far from the first principal surface of the multilayer body (second end of the coil) is connected to the second external electrode by a second-external-electrode connection conductor.

According to the above-described steps, the second-external-electrode connection conductor, which is a conductor (conductor with a long path length) that connects the coil conductor pattern far from the first principal surface of the multilayer body (second end of the coil) to the second external electrode, includes a conductor that provides interlayer connection between the insulating base materials. The conductor is not a stack of via conductors formed by solidifying the conductive paste, that is, not provided in the stacking process, and is therefore able to be easily manufactured. In addition, the resistance is able to be easily reduced by increasing the thickness of the metal film in the through hole.

The metal film is preferably formed by plating. In such a case, the metal film is able to be easily and collectively provided in the through hole. In addition, the thickness of the metal film is able to be easily reduced, and the resistance is able to be easily reduced accordingly.

Preferably, the plurality of insulating base materials are thermoplastic resin sheets, and are joined together by the hot-pressing. In this case, solidification and joining of the conductive paste occur at the same time as flow pressure bonding of the thermoplastic resin. Therefore, the manufacturing process is facilitated.

According to various preferred embodiments of the present invention, in a built-in-coil substrate in which each end of a coil is connected to a corresponding one of two external electrodes provided on the same surface, the second-external-electrode connection conductor, which is a conductor (conductor with a long path length) that connects the coil conductor pattern far from the first principal surface of the multilayer body (second end of the coil) to the second external electrode, has a reduced conductor resistance. In addition, the reliability of the second-external-electrode connection conductor is able to be easily ensured.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described with reference to the drawings with reference to specific examples. In the drawings, the same components are denoted by the same reference signs. In the second and following preferred embodiments, description of structures that are the same as those in the first preferred embodiment will be omitted, and only the differences will be described. In particular, similar effects obtained by similar structures will not be repeated in the description of each preferred embodiment.

First Preferred Embodiment

In a first preferred embodiment of the present invention, a built-in-coil substrate structured as a surface mounting chip coil component, for example, will be described.

Figure 1:
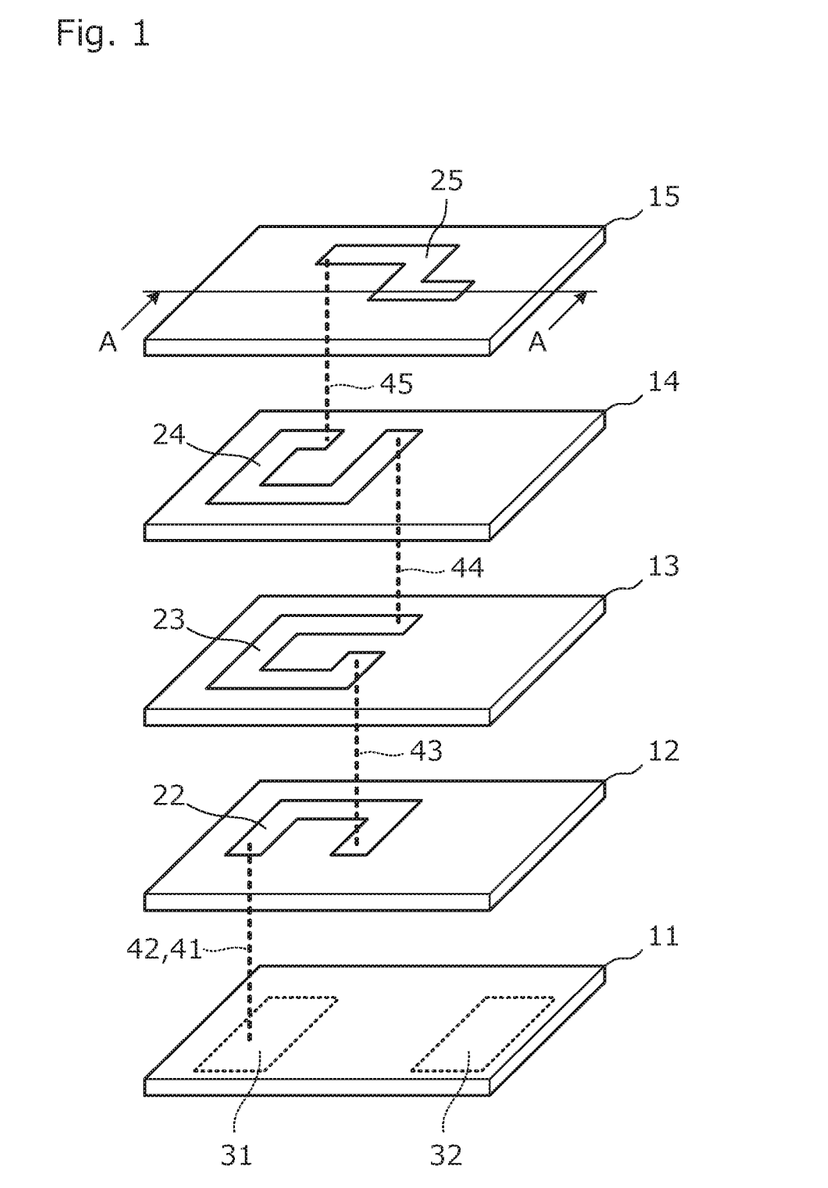
FIG. 1 is an exploded perspective view of a plurality of insulating base materials in a main portion of a built-in-coil substrate according to a first preferred embodiment of the present invention.
Figure 2:
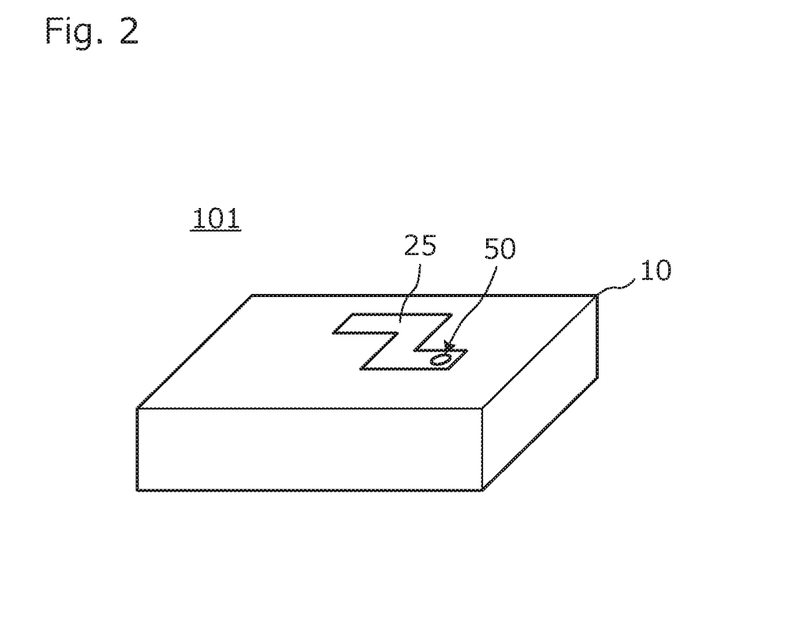
FIG. 2 is a perspective view of the built-in-coil substrate according to the first preferred embodiment of the present invention.

FIG. 1 is an exploded perspective view of a plurality of insulating base materials that define a main portion of a built-in-coil substrate according to the first preferred embodiment. FIG. 2 is a perspective view of the built-in-coil substrate 101 according to the present preferred embodiment.

The built-in-coil substrate 101 includes a multilayer body 10 obtained by stacking insulating base materials 11, 12, 13, 14, and 15 on which conductor patterns are provided. A coil includes the conductor patterns in the multilayer body 10.

The above-described conductor patterns include the following conductors.

(a) Coil conductor patterns 22, 23, 24, and 25 respectively provided on surfaces of the insulating base materials 12, 13, 14, and 15.

(b) Coil interlayer connection conductors 43, 44, and 45 respectively provided in the insulating base materials 13, 14, and 15.

(c) A first external electrode 31 and a second external electrode 32 provided on the bottom surface of the insulating base material 11 (first principal surface of the multilayer body 10).

(d) First-external-electrode connection conductors 41 and 42 that connect the coil conductor pattern close to the first principal surface of the multilayer body 10 (the bottom surface in FIGS. 1 and 2) to the first external electrode 31.

The coil interlayer connection conductors 43, 44, and 45 and the first-external-electrode connection conductors 41 and 42 are made of conductive paste.

The coil interlayer connection conductors 43, 44, and 45 are respectively provided in the insulating base materials 13, 14, and 15. The coil interlayer connection conductors 43, 44, and 45 provide interlayer connection between the coil conductor patterns that are adjacent to each other in a stacking direction in which the insulating base materials 11 to 15 are stacked together. More specifically, a second end of the coil conductor pattern 22 provided on the insulating base material 12 is connected to a first end of the coil conductor pattern 23 provided on the insulating base material 13 by the coil interlayer connection conductor 43. A second end of the coil conductor pattern 23 is connected to a first end of the coil conductor pattern 24 provided on the insulating base material 14 by the coil interlayer connection conductor 44. A second end of the coil conductor pattern 24 is connected to a first end of the coil conductor pattern 25 provided on the insulating base material 15 by the coil interlayer connection conductor 45.

The above-described coil conductor patterns 22, 23, 24, and 25 and the coil interlayer connection conductors 43, 44, and 45 define a single helical coil with a winding axis extending in the stacking direction of the insulating base materials. A first end of the coil conductor pattern 22 is a first end of the coil, and a second end of the coil conductor pattern 25 is a second end of the coil. Thus, the first end of the coil is disposed on the layer closest to the first principal surface, and the second end of the coil is disposed on the layer farthest from the first principal surface.

The external-electrode connection conductors 41 and 42 are respectively provided in the insulating base materials 11 and 12. The first end of the coil conductor pattern 22 is connected to the first external electrode 31 by the first-external-electrode connection conductors 41 and 42.

The second end of the coil conductor pattern 25 is connected to the second external electrode 32 by a second-external-electrode connection conductor, which will be described below. The second end of the coil conductor pattern 25 is provided with an extending portion formed by extending the coil conductor to a position at which the second-external-electrode connection conductor 50 is provided. However, in the present preferred embodiment, the extending portion is regarded as being included in the coil conductor pattern 25 for convenience. In the present preferred embodiment, the second end of the coil is connected to the second-external-electrode connection conductor 50 on the layer on which the coil conductor pattern 25 is provided. However, an extending conductor connected to the second end of the coil conductor pattern 25 may be provided on another layer, and the extending conductor may be connected to the second-external-electrode connection conductor 50.

Figure 3A:
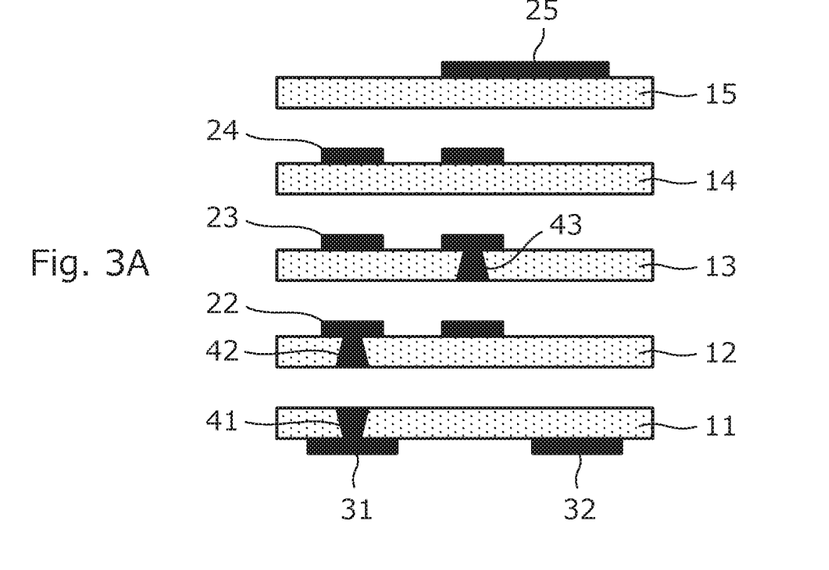
FIGS. 3A-3C illustrate manufacturing steps of the built-in-coil substrate according to the first preferred embodiment of the present invention.
Figure 3B:
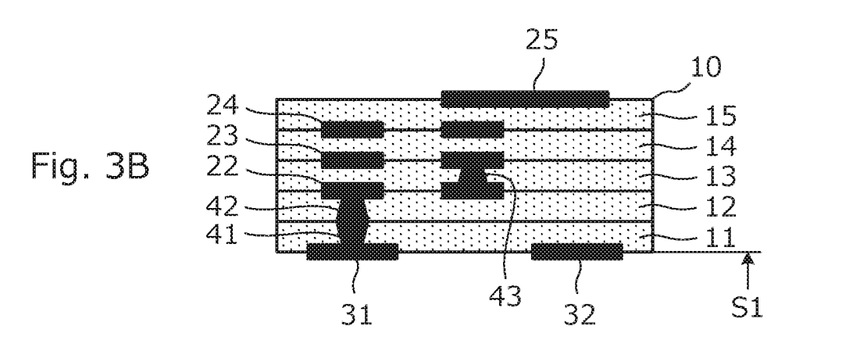
Figure 3C:
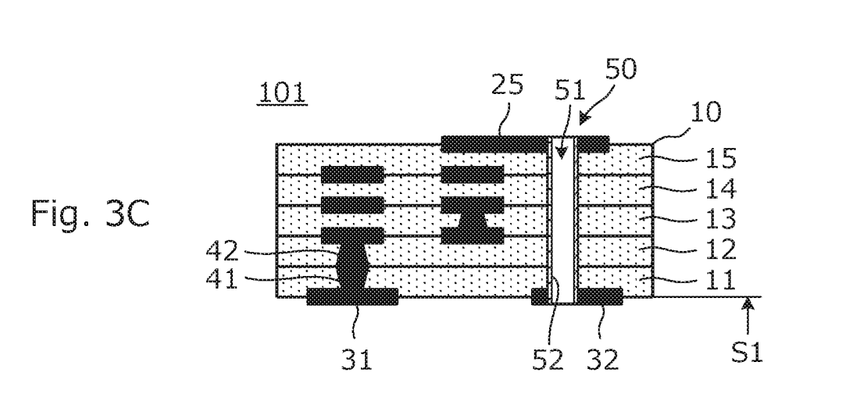

FIGS. 3A, 3B and 3C illustrate manufacturing steps of the built-in-coil substrate 101 according to the present preferred embodiment. FIG. 3A is a sectional view of the insulating base materials 11 to 15 on which the conductor patterns are formed, taken along line A-A in FIG. 1.

FIG. 3B is a sectional view of the multilayer body 10 after the insulating base materials 11 to 15 are stacked and hot-pressed. FIG. 3C is a sectional view of the built-in-coil substrate 101. As illustrated in FIG. 3C, a through hole 51 that extends through the multilayer body 10 in the stacking direction of the insulating base materials 11 to 15 is provided in the multilayer body 10, and a metal film 52 is provided in this through hole 51. The metal film 52 in the through hole 51 defines the second-external-electrode connection conductor 50. The second end of the coil conductor pattern 25 is connected to the second external electrode 32 by the second-external-electrode connection conductor 50, which is a conductor that provides interlayer connection between the insulating base materials 11 to 15.

The through hole 51 is formed by, for example, a laser machining device such as a UV laser. The metal film 52 is formed by, for example, forming a Cu film that defines and functions as a base by electroless plating, conducting electroplating of Cu, and then conducting electroplating of Au on the surface. For example, the base layer of Cu may be formed by sputtering or vacuum deposition instead of plating, and then electroplating of Au may be conducted.

The built-in-coil substrate 101 may be manufactured by, for example, the following steps.

(a) Thermoplastic resin sheets covered with metal foils are prepared. The thermoplastic resin sheets covered with metal foils, which become insulating base materials later, are made of a thermoplastic resin, such as liquid crystal polymer (LCP) resin or thermoplastic polyimide (PI), which is covered with, for example, Cu foils.

(b) The coil conductor patterns 22, 23, 24, and 25 are formed by subjecting the metal foils on the insulating base materials 12, 13, 14, and 15 to photolithographic patterning. In addition, the first external electrode 31 and the second external electrode 32 are provided on the insulating base material 11.

(c) Holes are formed by laser machining at positions where the coil interlayer connection conductors 43, 44, and 45 and the first-external-electrode connection conductors 41 and 42 are to be formed. The holes are formed so that they do not extend through the metal foils (coil conductor patterns and external electrodes).

(d) The holes are filled with conductive paste by printing.

(e) The insulating base materials 11 to 15 are stacked and hot-pressed. Thus, the insulating base materials 11 to 15 form a multilayer body and the conductive paste is solidified to form the coil interlayer connection conductors 43, 44, and 45 and the first-external-electrode connection conductors 41 and 42.

(f) The through hole 51 is formed so as to extend in the stacking direction of the insulating base materials 11 to 15 by the above-described method. The through hole 51 is formed so as to extend through the metal foils (coil conductor patterns and external electrodes).

(g) The metal film 52 is provided in the through hole 51 by the above-described method.

Although a single chip coil component has been described with reference to FIGS. 1, 2, and 3A-3C, multiple chip coil components are simultaneously provided in a collective substrate in the actual manufacturing process. The collective substrate is finally divided into individual pieces by a laser machine, so that multiple chip coil components are obtained.

According to the present preferred embodiment, the second-external-electrode connection conductor 50 is a conductor (conductor with a long path length) that connects the coil conductor pattern 25 (second end of the coil), which is far from the first principal surface S1 of the multilayer body 10, to the second external electrode 32, and is defined by the metal film 52 provided in the through hole 51 that extends through the multilayer body 10 in the stacking direction. Therefore, the conductor resistance of the second-externalelectrode connection conductor 50 is reduced. In addition, the reliability of the second-external-electrode connection conductor 50 is able to be easily increased.

Second Preferred Embodiment

According to a second preferred embodiment of the present invention, a built-in-coil substrate includes a second-external-electrode connection conductor provided on an end surface of a multilayer body.

Figure 4A:
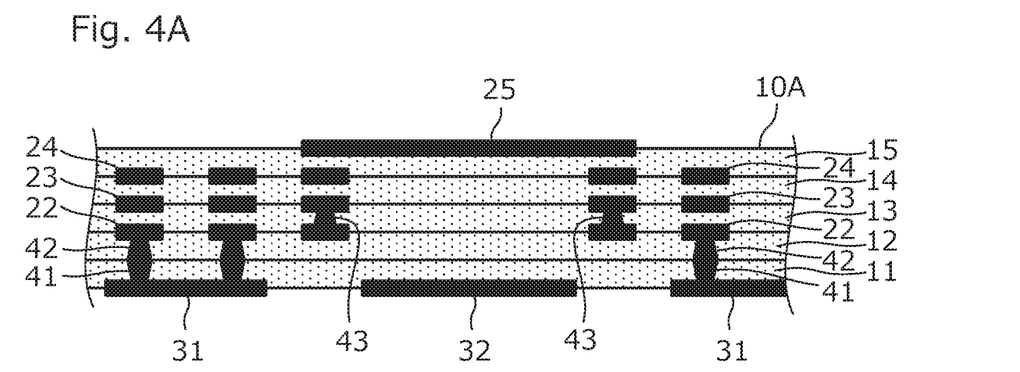
FIGS. 4A and 4B are sectional views illustrating manufacturing steps of built-in-coil substrates according to a second preferred embodiment of the present invention.
Figure 4B:
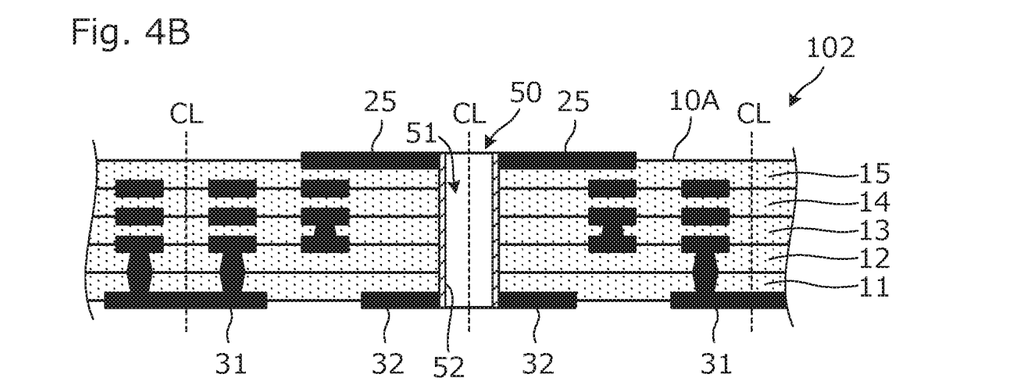
Figure 5:
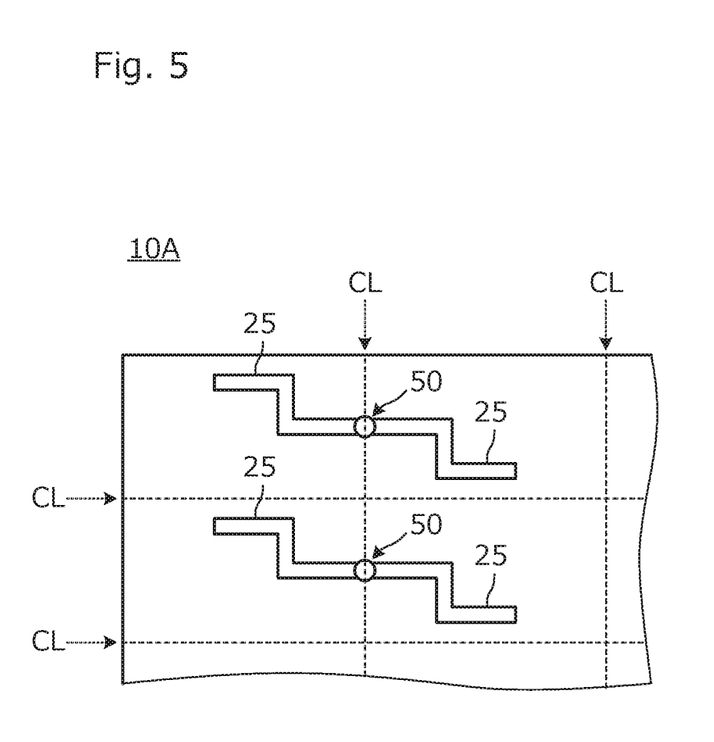
FIG. 5 is a partial plan view of a collective substrate.

FIGS. 4A and 4B are sectional views illustrating manufacturing steps of built-in-coil substrates 102 according to the second preferred embodiment. A collective substrate 10A in which a plurality of built-in-coil substrates are connected together is illustrated. FIG. 5 is a partial plan view of the collective substrate 10A.

FIG. 4A is a sectional view of the collective substrate 10A after insulating base materials 11 to 15 are stacked and hot-pressed. FIG. 4B is a sectional view of the collective substrate 10A.

A coil including conductor patterns similar to those of the first preferred embodiment illustrated in FIG. 1 is provided in the collective substrate 10A. As illustrated in FIG. 5, coil conductor patterns 25 of the adjacent coils are continuous to each other. Second external electrodes 32 of the adjacent coils are also continuous to each other. Furthermore, in this example, first external electrodes 31 of the adjacent coils are also continuous to each other.

As illustrated in FIG. 4B, a through hole 51 that extends through the collective substrate 10A in the stacking direction of the insulating base materials 11 to 15 is provided in the collective substrate 10A. A metal film 52 is provided in the through hole 51. The metal film 52 in the through hole 51 defines the second-external-electrode connection conductor 50. One second-external-electrode connection conductor 50 is provided for each pair of adjacent coils. The coil conductor patterns 25 are connected to the respective second external electrodes 32 by the second-external-electrode connection conductor 50.

Then, the collective substrate 10A is cut along cutting lines CL illustrated in FIGS. 4 and 5, and divided into individual pieces.

Figure 6:
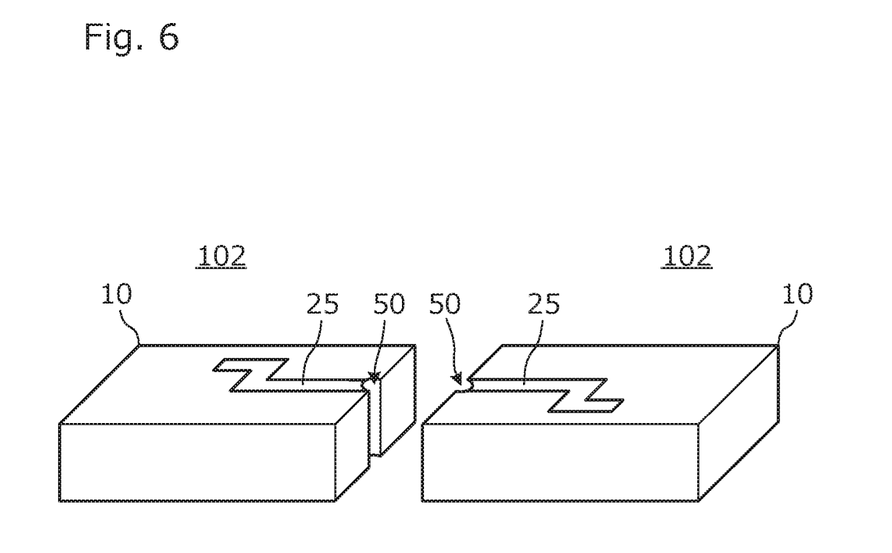
FIG. 6 is a perspective view of the built-in-coil substrates according to the second preferred embodiment of the present invention.

FIG. 6 is a perspective view of the built-in-coil substrates 102 according to the present preferred embodiment. The built-in-coil substrates 102 are obtained by dividing the collective substrate illustrated in FIG. 4B into individual pieces. The second-external-electrode connection conductor 50 is divided into two halves when the collective substrate is cut. In each multilayer body 10, the second end of the coil conductor pattern 25 is connected to the second external electrode 32 by the second-external-electrode connection conductor 50 exposed at an end surface of the multilayer body 10, as illustrated in FIG. 6.

As in the present preferred embodiment, the second-external-electrode connection conductor 50 that connects the second end of the coil conductor pattern 25 of the multilayer body 10 to the second external electrode 32 may be provided in an end surface of the multilayer body 10. As described in the first preferred embodiment, the second-external-electrode connection conductor 50 may have a two-layer structure including a Cu film that serves as a base and an Au film that serves as a surface. In such a case, the external-electrode connection conductor 50 strongly adheres to the end surface of the multilayer body 10, and the mechanical strength thereof is increased.

According to the present preferred embodiment, the second-external-electrode connection conductor is disposed at an end portion of the multilayer body (chip component). Therefore, while the external dimensions of the built-in-coil substrate are small, a coil with a large coil opening diameter is able to be provided.

Third Preferred Embodiment

Figure 7:
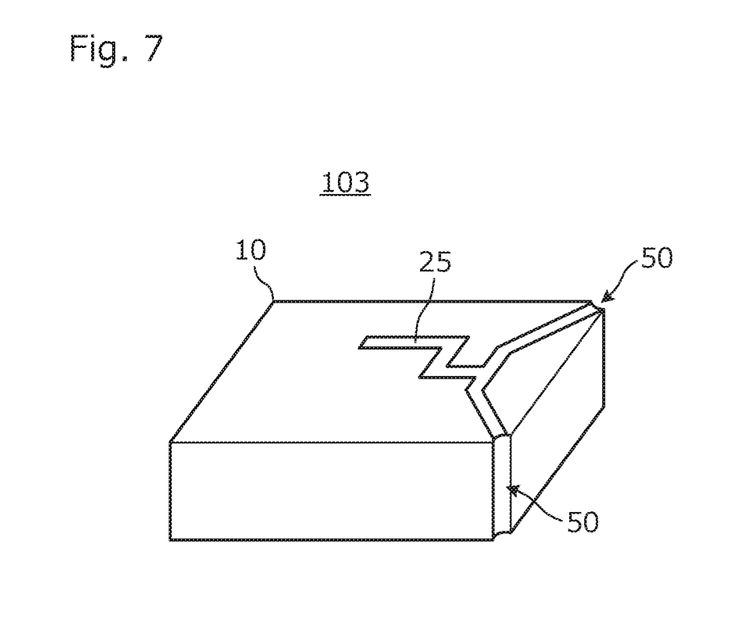
FIG. 7 is a perspective view of a built-in-coil substrate according to a third preferred embodiment of the present invention.
Figure 8:
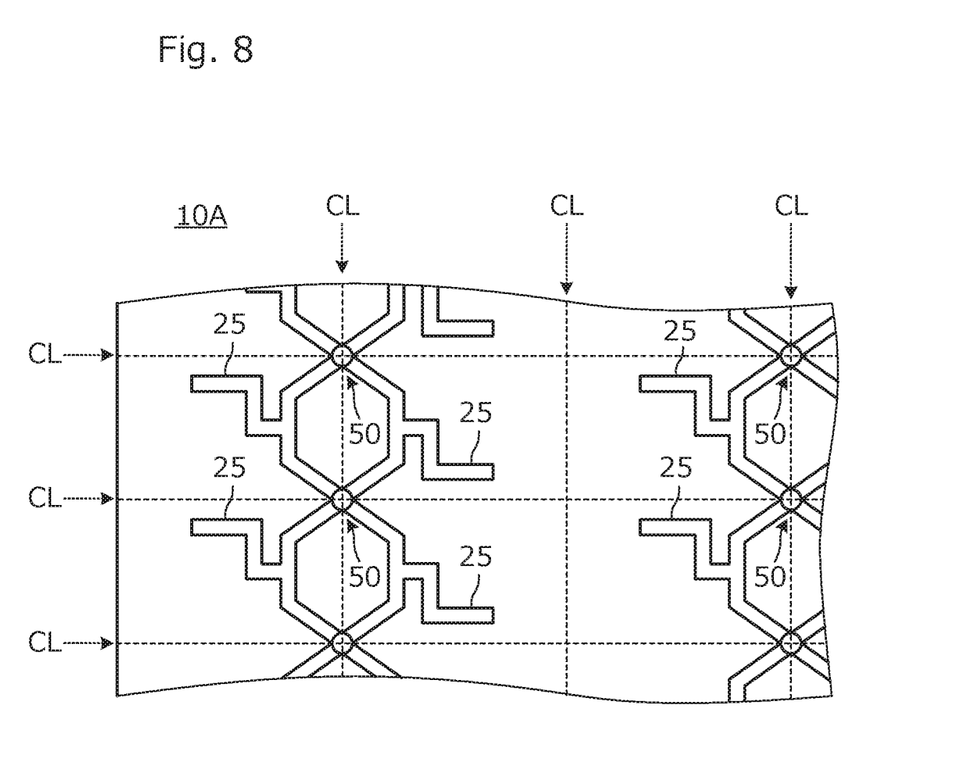
FIG. 8 is a partial plan view of a collective substrate in a process of manufacturing the built-in-coil substrate.

FIG. 7 is a perspective view of a built-in-coil substrate 103 according to a third preferred embodiment of the present invention. FIG. 8 is a partial plan view of a collective substrate 10A in a process of manufacturing the built-in-coil substrate 103.

The built-in-coil substrate 103 includes a multilayer body 10 preferably formed by stacking a plurality of insulating base materials on which conductor patterns are formed. In the multilayer body 10, a coil includes conductor patterns similar to those of the first preferred embodiment illustrated in FIG. 1. As illustrated in FIG. 7, a coil conductor pattern 25 branches into two portions that extend to two corners of the multilayer body 10. As illustrated in FIG. 8, in the collective substrate, each coil conductor pattern 25 branches into portions that are continuous not only in the left-right direction but also in the top-bottom direction.

As illustrated in FIG. 8, through holes that extend through the collective substrate 10A in the stacking direction of the insulating base materials are provided in the collective substrate 10A. A metal film is provided in each through hole. The metal film in each through hole defines a second-external-electrode connection conductor 50. One second-external-electrode connection conductor 50 is provided for four coils that are adjacent to each other. A second external electrode provided on the bottom surface of the multilayer body 10 is connected to the coil conductor pattern 25 provided on the top surface of the multilayer body 10 by the second-external-electrode connection conductors 50. More specifically, the second external electrode is connected to the coil conductor pattern 25, which branches into two portions, by two second-external-electrode connection conductors 50.

Then, the collective substrate 10A is cut along cutting lines CL illustrated in FIG. 8, and is divided into individual pieces. Thus, the built-in-coil substrate 103 is obtained.

As in the present preferred embodiment, the second-external-electrode connection conductors 50 that connect end portions of the coil conductor pattern 25 of the multilayer body 10 to the second external electrode may be provided at two corners of the multilayer body.

According to the present preferred embodiment, an end surface of the multilayer body is able to be utilized for a purpose other than providing connection with an external electrode. In addition, since two second-external-electrode connection conductors 50 are provided, conductor loss caused by the second-external-electrode connection conductors 50 is reduced. In addition, according to the present preferred embodiment, built-in-coil substrates 103 of the same type (with the same structure) is able to be obtained.

Other Preferred Embodiments

In the above-described preferred embodiments, a coil conductor pattern preferably is exposed at the top surface of the multilayer body 10. However, an insulating base material on which no conductor pattern is provided may be stacked at the top. Also, a protective sheet may be attached to the top surface of the multilayer body after the multilayer body is formed. The multilayer body covered with the protective sheet also has a through hole to form the second-external-electrode connection conductor.

In the above-described preferred embodiments, the second-external-electrode connection conductor 50 preferably includes a first end connected to the coil conductor pattern 25 and a second end connected to the second external electrode 32. However, the second-external-electrode connection conductor 50 may also be electrically connected to another conductor at a location between the first and second ends (intermediate position). For example, in the example illustrated in FIG. 3C, a pad conductor pattern may be provided on the insulating base material 13 at or around the location where the second-external-electrode connection conductor 50 is provided, and the through hole 51 may be formed so as to extend through the pad conductor pattern. In this case, the mechanical strength of the second-external-electrode connection conductor 50 is able to be increased.

In the third preferred embodiment, when the collective substrate 10A is divided into individual pieces, two portions of the second-external-electrode connection conductor 50 obtained by dividing each of the second-external-electrode connection conductors 50 into quarters are formed at two corners of the individual piece respectively. However, when the collective substrate 10A is divided into individual pieces, one portion of the second-external-electrode connection conductor 50 obtained by dividing each of the second-external-electrode connection conductors 50 into quarters may be formed at one corner of the individual piece. In such a case, the proportion of the area of the second-external-electrode connection conductor 50 to the surface area of the individual piece is reduced.

In each of the above-described preferred embodiments, the built-in-coil substrate is preferably used as a chip coil component. However, preferred embodiments of the present invention may also be applied to a substrate in which circuits and components other than the coil are formed together with the coil.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A built-in-coil substrate comprising:
   a coil including a conductor pattern in a multilayer body including a plurality of insulating base materials stacked in a stacking direction; wherein
   the multilayer body includes:
   a first principal surface;
   a second principal surface provided opposite to the first principal surface; and
   a side surface provided between the first principal surface and the second principal surface; and
   the conductor pattern includes:
   coil conductor patterns provided on surfaces of the plurality of insulating base materials and including:
   a first coil conductor pattern; and
   a second coil conductor pattern farther from the first principal surface of the multilayer body than the first coil conductor pattern;
   a coil interlayer connection conductor made of solidified conductive paste, the coil interlayer connection conductor providing interlayer connection between the coil conductor patterns that are adjacent to each other in the stacking direction;
   a first external electrode and a second external electrode provided on the first principal surface of the multilayer body, and not provided on the second principal surface or the side surface of the multilayer body; and
   a first-external-electrode connection conductor that connects the first coil conductor pattern to the first external electrode; wherein
   the coil has a winding axis extending in the stacking direction;
   the built-in-coil substrate includes a second-external-electrode connection conductor connecting the second coil conductor pattern to the second external electrode; and
   the second-external-electrode connection conductor includes a conductor that provides interlayer connection between the plurality of insulating base materials, the conductor including a metal film provided in a through hole that extends through the multilayer body in the stacking direction.

2. The built-in-coil substrate according to claim 1, wherein each of the plurality of insulating base materials is a thermoplastic resin sheet.

3. The built-in-coil substrate according to claim 1, wherein the coil is a single helical coil.

4. The built-in-coil substrate according to claim 1, wherein the conductor pattern includes a plurality of conductor patterns provided in the multilayer body.

5. The built-in-coil substrate according to claim 1, wherein the conductor pattern branches into two portions that extend to two corners of the multilayer body.

6. The built-in-coil substrate according to claim 1, wherein at least one of the coil conductor patterns is exposed at the second principal surface of the multilayer body.

7. The built-in-coil substrate according to claim 1, further comprising an insulating base material with no conductor pattern provided thereon at a top of the multilayer body.

8. The built-in-coil substrate according to claim 1, further comprising a protective sheet on the second principal surface of the multilayer body.

9. The built-in-coil substrate according to claim 1, wherein the first-external-electrode connection conductor provides interlayer connection between the first coil conductor pattern and the first external electrode, is in contact with the first external electrode, and is provided within the multilayer body.

10. The built-in-coil substrate according to claim 1, wherein the metal film does not include any layers made of a solidified conductive paste.

* * * * *